United States Patent [19]

Jones

[11] Patent Number: 5,051,711
[45] Date of Patent: Sep. 24, 1991

[54] VARIABLE BANDWIDTH CRYSTAL FILTER WITH VARACTOR DIODES

[75] Inventor: Lee J. Jones, Dandridge, Tenn.

[73] Assignee: Ten-Tec, Inc., Sevierville, Tenn.

[21] Appl. No.: 344,277

[22] Filed: Apr. 27, 1989

[51] Int. Cl.$^5$ ............................................. H03H 9/58
[52] U.S. Cl. ...................................... 333/188; 333/189
[58] Field of Search .............. 333/188, 189, 191, 192, 333/174; 310/320–322

[56] References Cited

U.S. PATENT DOCUMENTS

| | | | |
|---|---|---|---|
| 2,248,776 | 7/1941 | Och | 333/188 |
| 2,267,957 | 12/1941 | Sykes | 333/188 |
| 3,110,004 | 11/1963 | Pope | 333/175 |
| 3,416,104 | 12/1968 | Argoudelis | 333/189 |
| 3,697,903 | 10/1972 | Sauerland | 333/189 |
| 4,028,647 | 6/1977 | Yee | 333/192 |
| 4,060,776 | 11/1977 | Blinchikoff | 333/190 X |
| 4,342,014 | 7/1982 | Arvanitis | 333/192 X |
| 4,849,721 | 7/1989 | Matsuura | 333/174 |

FOREIGN PATENT DOCUMENTS

| | | | |
|---|---|---|---|
| 94408 | 5/1986 | Japan | 333/191 |
| 227414 | 10/1986 | Japan | 333/174 |

Primary Examiner—Eugene R. LaRoche
Assistant Examiner—Benny T. Lee
Attorney, Agent, or Firm—Hugh D. Jaeger

[57] ABSTRACT

A crystal filter with continuously variable passband, and a constant input and output impedance using quartz crystals, fixed inductors and varactor diodes. The width of the filter passband is set by a DC voltage on a single control line through a resistor biasing network.

1 Claim, 4 Drawing Sheets

VARIABLE BANDWIDTH CRYSTAL FILTER WITH VARACTOR DIODES

BACKGROUND OF THE INVENTION

1. Field of the Invention

The present invention relates to electric signal filters used in electronic communications systems and, more particularly, pertains to intermediate frequency bandpass filter used to provide frequency selectivity in either a radio receiver or a radio transmitter.

2. Description of the Prior Art

Prior to the present invention, multiple bandwidth systems required a bank of fixed bandwidth filters, each composed of several quartz crystals and fixed passive components, and a switching scheme to select a filter with the desired passband. This was a costly physical circuit arrangement because of the duplication of circuitry in each of the unselected filters.

Crystal filters with circuit topologies similar to the present invention have been used before, but, given a set of quartz crystals, the design required a different impedance level for each design bandwidth, as described by M. Dishal, *Modern Network Theory Design of Single-Sideband Crystal Ladder Filters*, Proc. IEEE, Vol. 53, No. 9, Sept. 1965. Therefore, even though it was possible to use identical quartz crystals for different bandwidths, each filter required a different set of passive components of capacitors, inductors and transformers to achieve the desired bandwidth. This made each filter so unique that it was necessary to switch complete filter units to select different bandwidths.

An excellent discussion of crystal ladder filters is found in "Crystal Ladder Filters, How to Build Low-Cost s.s.b Filters Using Surplus Crystals" by J. Pocket, F6BQP, in *Wireless World*, July, 1977.

Typical crystal ladder filters - All crystals are of the same resonant frequency--preferably between 8 and 10 MHz for single side band units. Three and four-crystal filters are capable of giving very good results. Two-crystal filters, although reasonably good, have relatively poor shape factors. A filter of this kind can be made using two, three or four crystals in series. The choice of impedance is important because, in effect, the more this is reduced the more the passband is reduced and the higher will be the insertion loss. This is because the series resistance of the crystal becomes more significant in relation to the impedance.

On the other hand, if one chooses an impedance which is too high, the calculations will result in low capacitance values, and construction then becomes limited by the stray circuit capacitances.

In practice, for a frequency of about 8 to 10 MHz, the impedance should be about 800 to 1000 ohms to obtain a passband of 2100 Hz, suitable for s.s.b.

It is necessary to underline the importance of the impedance of a filter no matter what type is used. It is also of paramount importance that the filter should be correctly terminated because any significant mismatch could lead to a passband ripple of some 10 dB.

It is possible to adjust the values of the capacitors; reducing them increases the passband but also increases the ripple in the passband. If a ripple of 2 dB can be accepted, the passband can be increased by up to 20%. Note that it is advisable not to take advantage of this opportunity unless the necessary test instruments are available to check the results of any such adjustments (a wobbulator and oscilloscope are the ideal instruments for this type of adjustment). By using a lower frequency and lower impedance, it is possible to make an excellent CW filter.

The present invention overcomes the disadvantages of the prior art by providing a crystal filter with varactor diodes where the width of the filter passband is set by a DC voltage through a resistor biasing network on a single control line.

SUMMARY OF THE INVENTION

The general purpose of the present invention uses a single set of quartz crystals in a ladder configuration, fixed inductors, and varactor diodes to achieve a filter with bandwidth continuously variable over a range that is normally covered by switch-selecting several fixed bandwidth filters. Additionally, this filter circuit automatically performs the required impedance matching at the input and the output to provide a constant circuit impedance external to the filter circuit.

According to one embodiment of the present invention, there is provided a crystal filter with varactors whereby the width of the filter passband is controlled by a DC voltage on a single control line through a resistor biasing network. The filter includes an input matching section, a crystal filter section with varactor diodes, an output matching section, a resistor biasing section connected to the other sections, and a DC control voltage connected to the resistor biasing network.

The variable passband crystal filter uses varactor diodes for bandwidth control. The filter also uses fixed inductors and varactor diodes to produce constant input and output impedances in the variable passband filter. An adjustable resistor biasing network compensates for the tolerances of the varactor diodes.

One significant aspect and feature of the present invention is a continuously variable bandwidth of an IF filter system which enhances operation in the various transmission modes (e.g., c.w., s.s.b., etc.). One filter range is 350 Hz to 3.5 kHz. This filter design conserves physical space and completely eliminates the need for accessory filters to provide narrow and wide IF bandwidths. The continuously variable feature allows adjustment for best and enhanced performance on any mode.

Another significant aspect and feature of the present invention is a filter for use in commercial and consumer electronics. The filter is particularly intended for use in communications equipment, both commercial and consumer. One such use for the filter, by way of example and for purposes of illustration only and not to be construed as limiting of the present invention, is in amateur radio transceivers.

Having thus described the embodiments of the present invention, it is a principal object hereof to provide a crystal filter in a ladder configuration including fixed inductors and varactor diodes. The width of the filter passband is controlled by DC voltage on a single control line through a resistor biasing network.

One object of the present invention is to substitute a bank of fixed bandwidth filters with a single variable bandwidth filter of the circuit configuration as described at a lower cost than the sum of the filters replaced.

Another object of the present invention is to reduce the overall complexity of the filtering system by reducing the number of filters required and eliminating any switching circuitry.

Another object of the present invention is to provide for the use of higher tolerance components because of the full adjustability of the filter circuit described.

A further object of the present invention is to allow electronic control through a resistor biasing network and a variable DC control voltage of filter bandwidth further eliminating all mechanical switching of banked filters.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
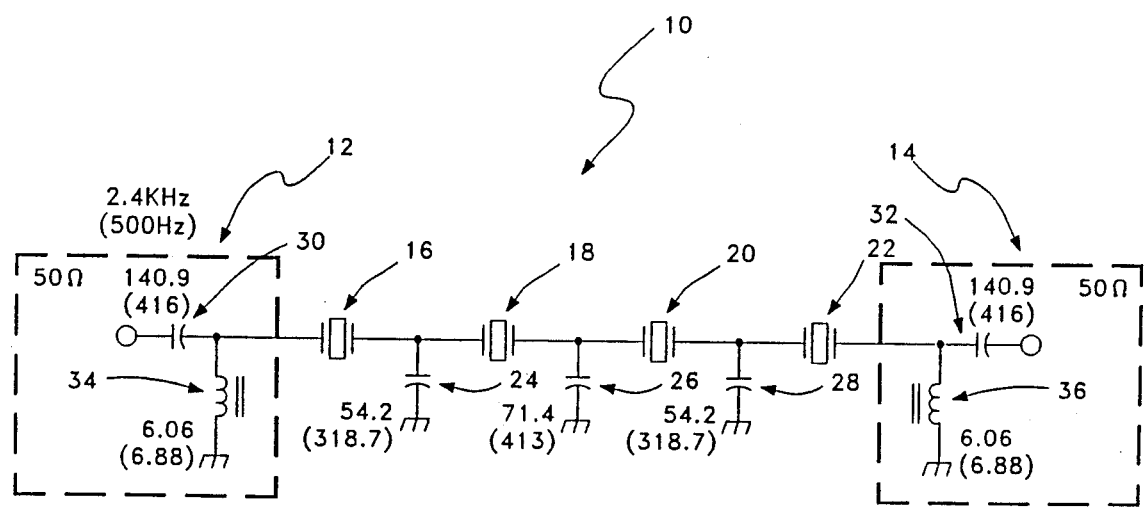
FIG. 1 illustrates a prior art crystal filter.
Figure 4:
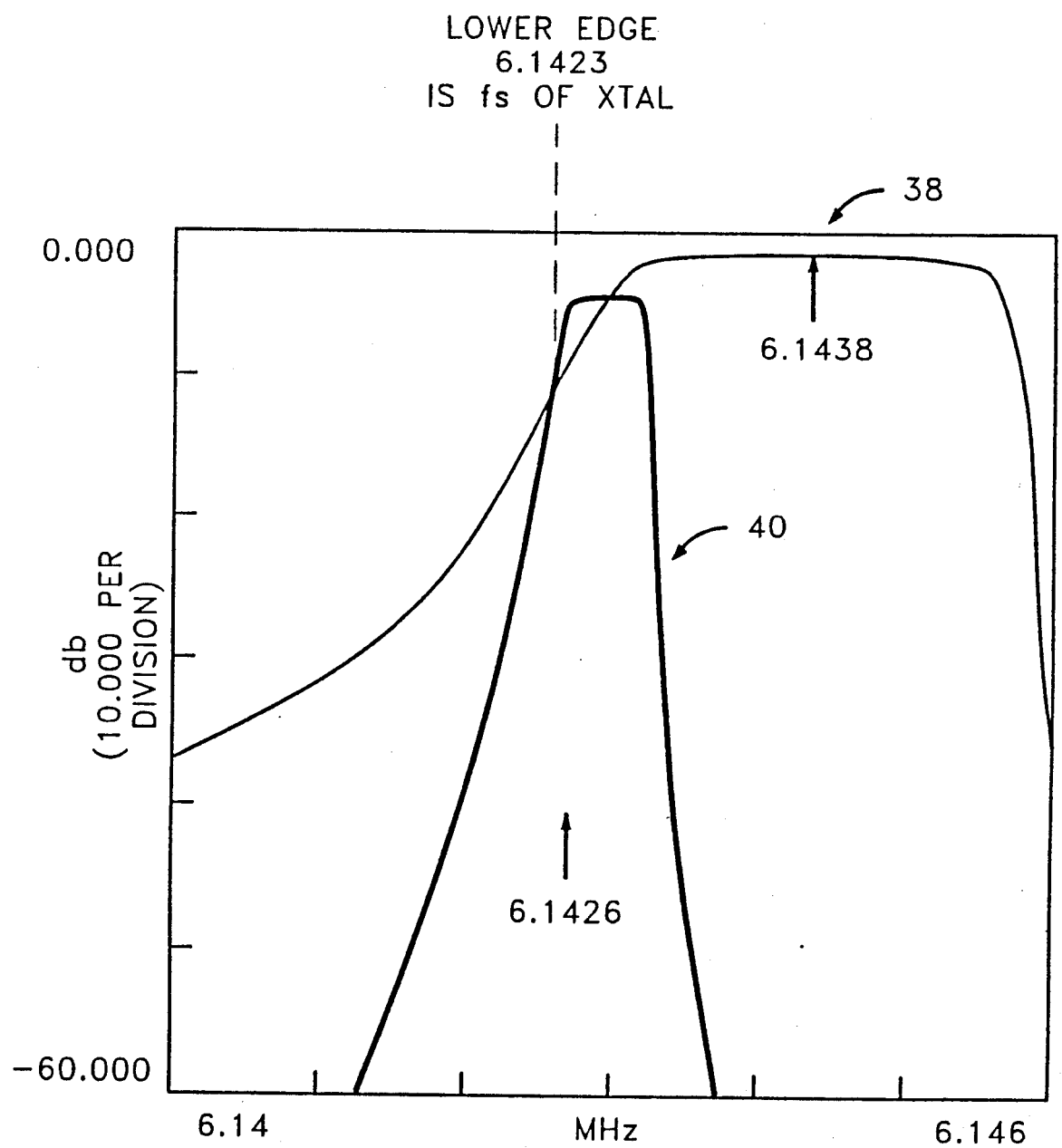

FIG. 1 illustrates a schematic diagram of a prior art four crystal ladder bandpass filter 10 with impedance matching networks 12 and 14 at each end a outlined with dashed lined boxes. The bandpass filter 10 includes four crystals 16, 18, 20 and 22 in a ladder configuration, and capacitors 24, 26 and 28. Each impedance matching network includes capacitors 30 and 32 and inductors 34 and 36. Two sets of component values are shown as now described. The curve 38 at the top of FIG. 4 corresponds to the filter response obtained with the upper set of component values. The curve 40 of FIG. 4 is the response obtained with the lower set of component values (those in parenthesis). FIG. 1, therefore, illustrates the designs of two prior art filters; one of narrow bandwidth of about 500 Hz illustrated by curve 40 and another of wide bandwidth of about 2400 Hz as illustrated by curve 38. However, since the inductor in the matching sections has nearly the same value in both filters, only the capacitors need be changed to change the bandwidth of this filter over the desired range.

Figure 2:
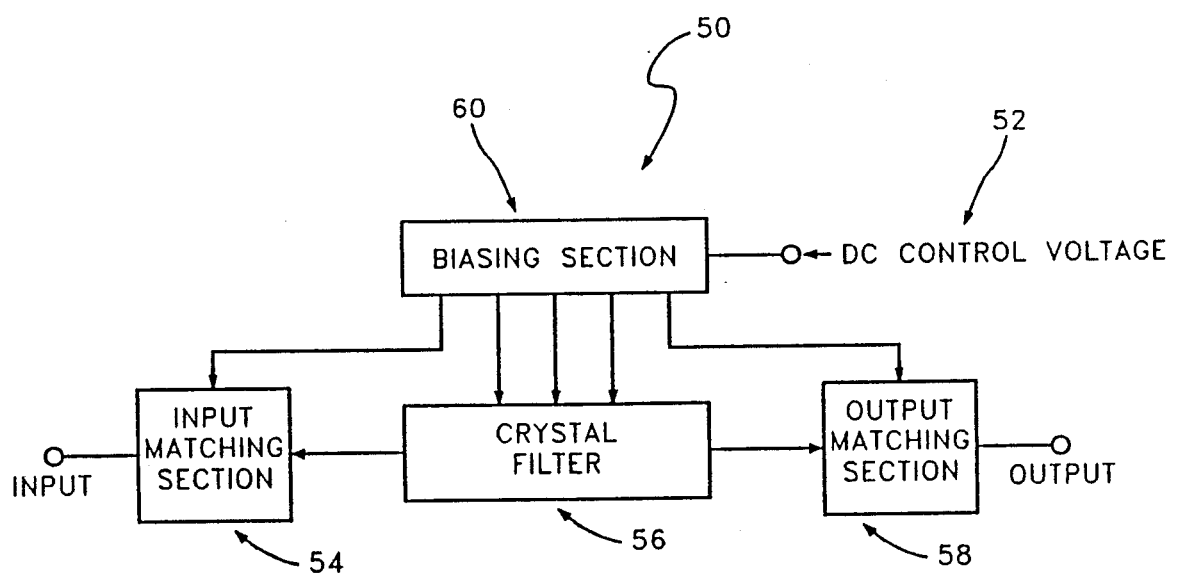
FIG. 2 illustrates a block diagram of a crystal filter of the present invention.

FIG. 2 illustrates a block diagram of the varactor variable bandwidth crystal filter 50 of the present invention including input coupled to the input matching section 54, the crystal filter 56, the output matching section 58 coupled to output, the biasing section 60, and the DC control voltage 52.

Figure 3:
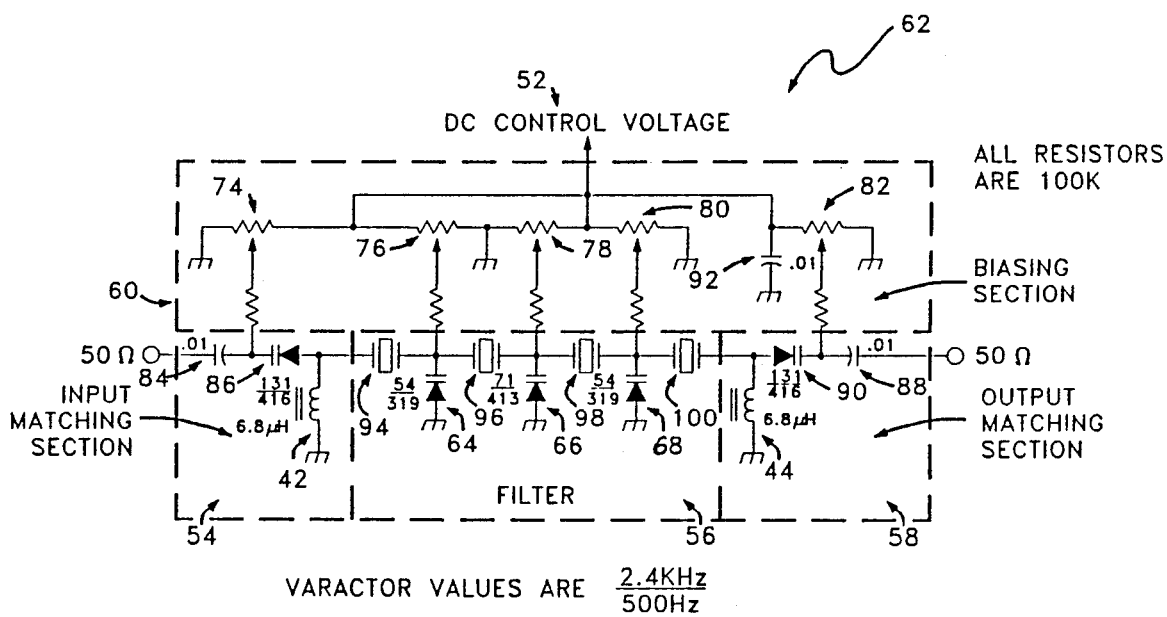
FIG. 3 illustrates a schematic diagram of the crystal filter of the present invention; and, FIG. 4 illustrates a passband graph of db versus megahertz of the crystal filter both the prior art and the present invention.

FIG. 3 illustrates a schematic diagram of a four crystal variable bandwidth crystal filter 62 of the present invention. Four crystals 94, 96, 98 and 100 are used by way of example and for purposes of illustration only, and not to be construed as limiting as any other number of crystals could be utilized. The matching inductors 42 and 44 are fixed values. The capacitors 24, 26 and 28 of FIG. 1 have now been replaced by varactor diodes 64, 66 and 68 of FIG. 3 of the present invention. A DC control voltage 52 is applied to each varactor diode 64, 66 and 68 through a resistor biasing network 60 which is adjusted to produce the varactor capacitances shown at each end of the control voltage. The resistor biasing network 60 includes calibration variable resistors 74, 76, 78, 80 and 82. The input impedance matching section 54 includes a coupling capacitor 84 and a matching network varactor 86. The output impedance matching section 58 includes a coupling capacitor 88 and a matching network varactor 90. A bypass capacitor 92 connects to the DC control voltage. The top set of component values are for the curve 38 and the bottom set of component values are for the curve 40, as shown in FIG. 4. The component values illustrated in FIG. 3 are by way of example and for purposes of illustration only and not to be construed as limiting of the present invention.

MODE OF OPERATION

FIG. 4 illustrates the passband response in db versus bandwidth for the filters of FIGS. 1 and 3. The curve 38 at the top of FIG. 4 corresponds to the filter response obtained with the upper set of component values. The curve 40 of FIG. 4 is the response obtained with the lower set of component values (those in parenthesis). The center of each passband is illustrated, the lower edge of each passband is approximately the crystal frequency, and the BFO frequency in the Figure.

Various modifications can be made to the present invention without departing from the apparent scope hereof.

I claim:

1. A variable passband crystal filter comprising:
   a. a plurality of crystals, each crystal having the seam resonant frequency, electrically coupled in series to form a plurality of junctions between adjacent crystals;
   b. a plurality of varactor diodes, wherein a different one of said plurality of varactor diodes is connected between a different one of said plurality of said junctions between adjacent crystals, and ground;
   c. input matching section means and output matching section means respectively connected to crystals located at ends of said plurality of crystals in series, said input section means and said output section means each comprises a series coupling of a terminal, a capacitor, and a varactor diode, and further comprising an indicator connected from said varactor to ground, each said varactor diode is connected to respective end crystals of said plurality of crystals in series; and,
   d. a plurality of biasing resistor means, a different one of said plurality of resistors is connected between each of said plurality of junctions between said adjacent crystals, and between respective junctions of said varactor diode and said capacitor of said input matching section and said output matching section, said biasing resistors also connected to a DC control voltage.

* * * * *